(12) United States Patent
Chan et al.

(10) Patent No.: US 12,002,710 B2
(45) Date of Patent: Jun. 4, 2024

(54) SEMICONDUCTOR STRUCTURE AND METHODS OF FORMING THE SAME

(71) Applicant: Taiwan Semiconductor Manufacturing Co., Ltd., Hsinchu (TW)

(72) Inventors: Yu-Hsin Chan, Hsinchu (TW); Jiing-Feng Yang, Hsinchu County (TW); Kuan-Wei Huang, Taoyuan (TW); Meng-Shu Lin, Hsinchu (TW); Yu-Yu Chen, Hsinchu (TW); Chia-Wei Wu, Miaoli County (TW); Chang-Wen Chen, Hsinchu (TW); Wei-Hao Lin, Hsinchu (TW); Ching-Yu Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 106 days.

(21) Appl. No.: 16/924,200

(22) Filed: Jul. 9, 2020

(65) Prior Publication Data
US 2022/0013407 A1  Jan. 13, 2022

(51) Int. Cl.
| | | |
|---|---|---|
| *H01L 21/768* | (2006.01) | |
| *H01L 21/033* | (2006.01) | |
| *H01L 21/311* | (2006.01) | |
| *H01L 23/528* | (2006.01) | |

(52) U.S. Cl.
CPC .... *H01L 21/76816* (2013.01); *H01L 21/0335* (2013.01); *H01L 21/0337* (2013.01); *H01L 21/0338* (2013.01); *H01L 21/31144* (2013.01); *H01L 21/7684* (2013.01); *H01L 21/76877* (2013.01); *H01L 23/528* (2013.01)

(58) Field of Classification Search
CPC ............ H01L 21/0334; H01L 21/0335; H01L 21/0337; H01L 21/0338; H01L 21/0332; H01L 21/3086–3088; H01L 21/32139; H01L 21/76816; H01L 21/7684; H01L 21/31116; H01L 21/31144; H01L 23/528; H01L 21/76877
See application file for complete search history.

(56) References Cited

U.S. PATENT DOCUMENTS

| | | | | |
|---|---|---|---|---|
| 9,870,942 B1 * | 1/2018 | Wu | ................... | H01L 21/31155 |
| 2013/0072022 A1 * | 3/2013 | Lee | ...................... | H01L 21/3086 438/696 |
| 2013/0089984 A1 * | 4/2013 | Raghunathan | ...... | H01L 21/0337 438/696 |
| 2014/0024209 A1 * | 1/2014 | Jung | ................... | H01L 21/3088 438/595 |

(Continued)

*Primary Examiner* — Shaun M Campbell
*Assistant Examiner* — Aneta B Cieslewicz
(74) *Attorney, Agent, or Firm* — JCIPRNET

(57) ABSTRACT

A semiconductor structure and method of forming the same are provided. The method includes: forming a plurality of mandrel patterns over a dielectric layer; forming a first spacer and a second spacer on sidewalls of the plurality of mandrel patterns, wherein a first width of the first spacer is larger than a second width of the second spacer; removing the plurality of mandrel patterns; patterning the dielectric layer using the first spacer and the second spacer as a patterning mask; and forming conductive lines laterally aside the dielectric layer.

20 Claims, 15 Drawing Sheets

(56) References Cited

U.S. PATENT DOCUMENTS

2014/0113438 A1* 4/2014 Usami ............... H01L 21/76813
438/488
2014/0273441 A1* 9/2014 Kim ..................... H01L 21/283
438/666
2015/0011090 A1* 1/2015 Liang ................ H01L 21/31144
438/703
2015/0155198 A1* 6/2015 Tsai .................... H01L 21/3085
438/674
2015/0318181 A1* 11/2015 Cantone .......... H01L 21/823431
438/702

* cited by examiner

SEMICONDUCTOR STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs. Such scaling down has also increased the complexity of manufacturing ICs and, for these advances to be realized, similar developments in IC manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
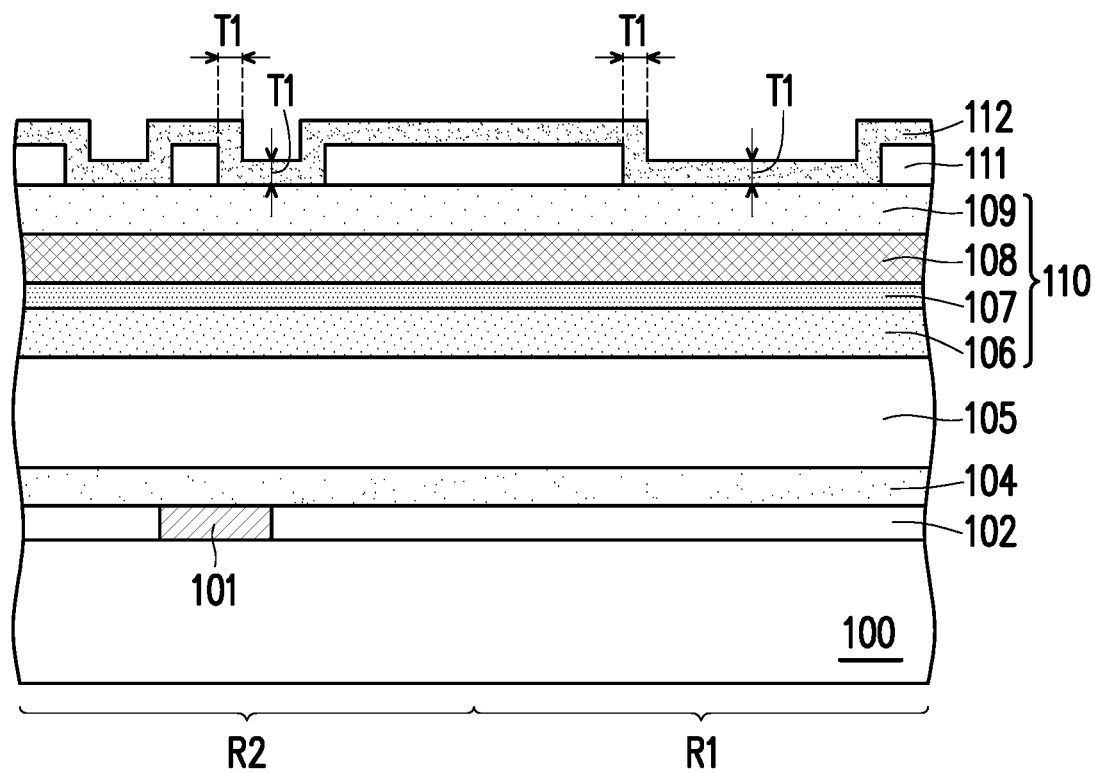
FIG. 1A to FIG. 1P are schematic cross-sectional views illustrating a method of forming a semiconductor structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of the disclosure are directed to provide a patterning method to provide dielectric patterns with different widths, thereby defining multiple spacing between conductive lines.

Figure 1B:
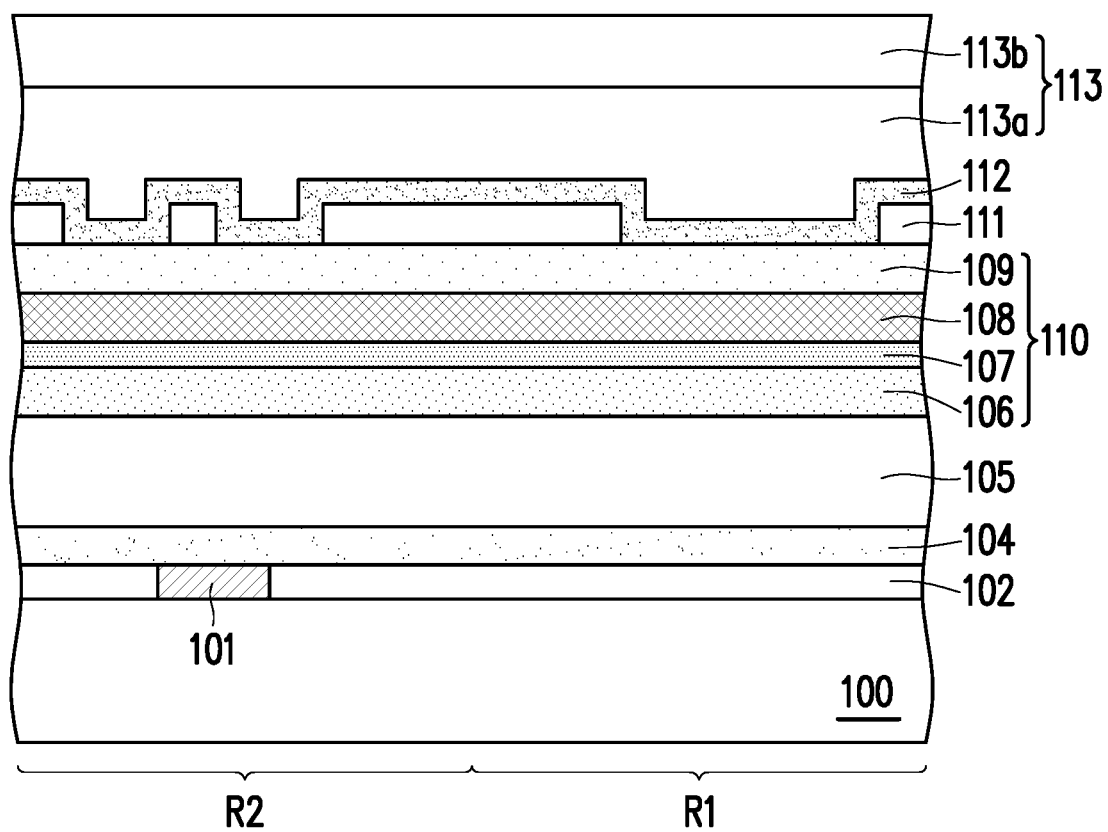
Figure 1C:
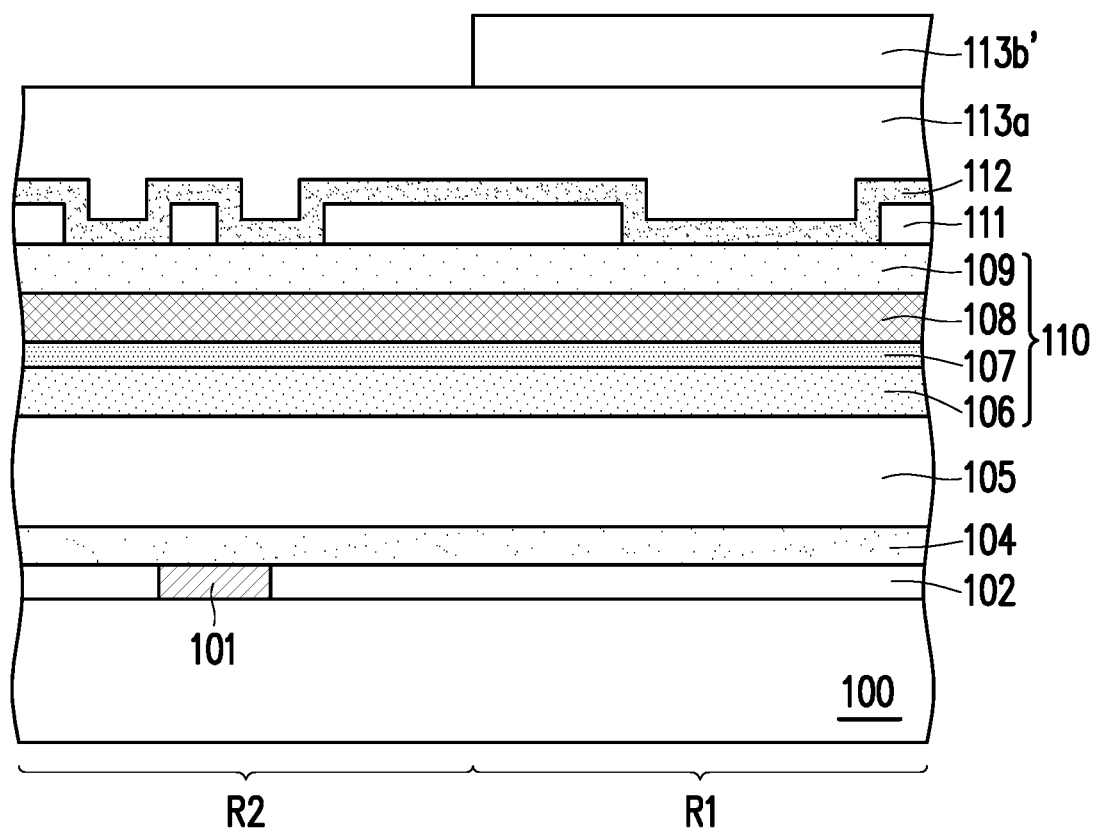
Figure 1D:
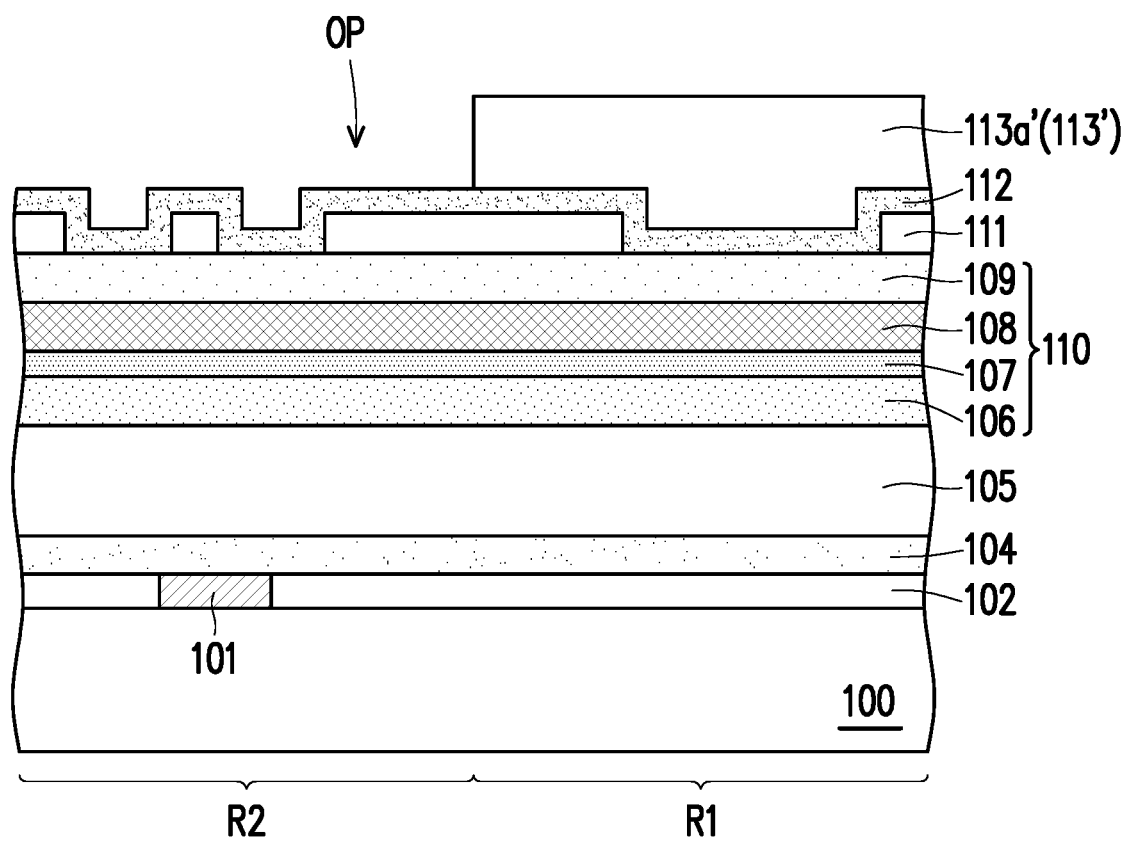
Figure 1E:
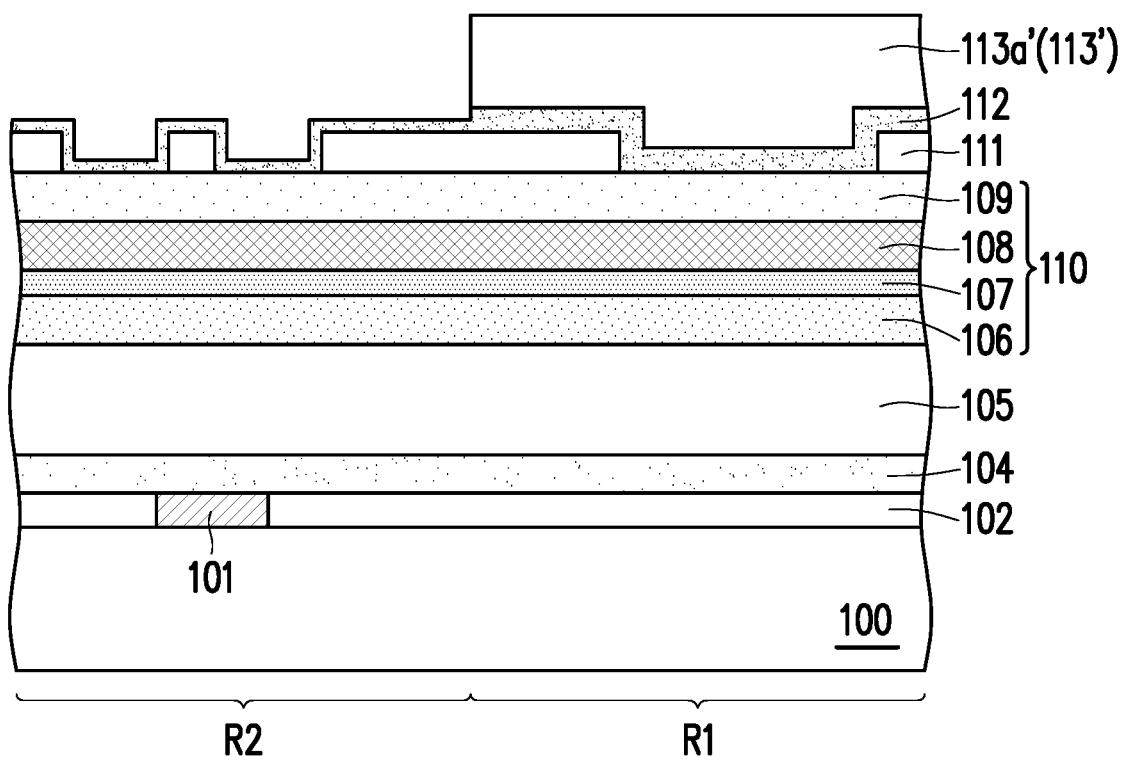
Figure 1F:
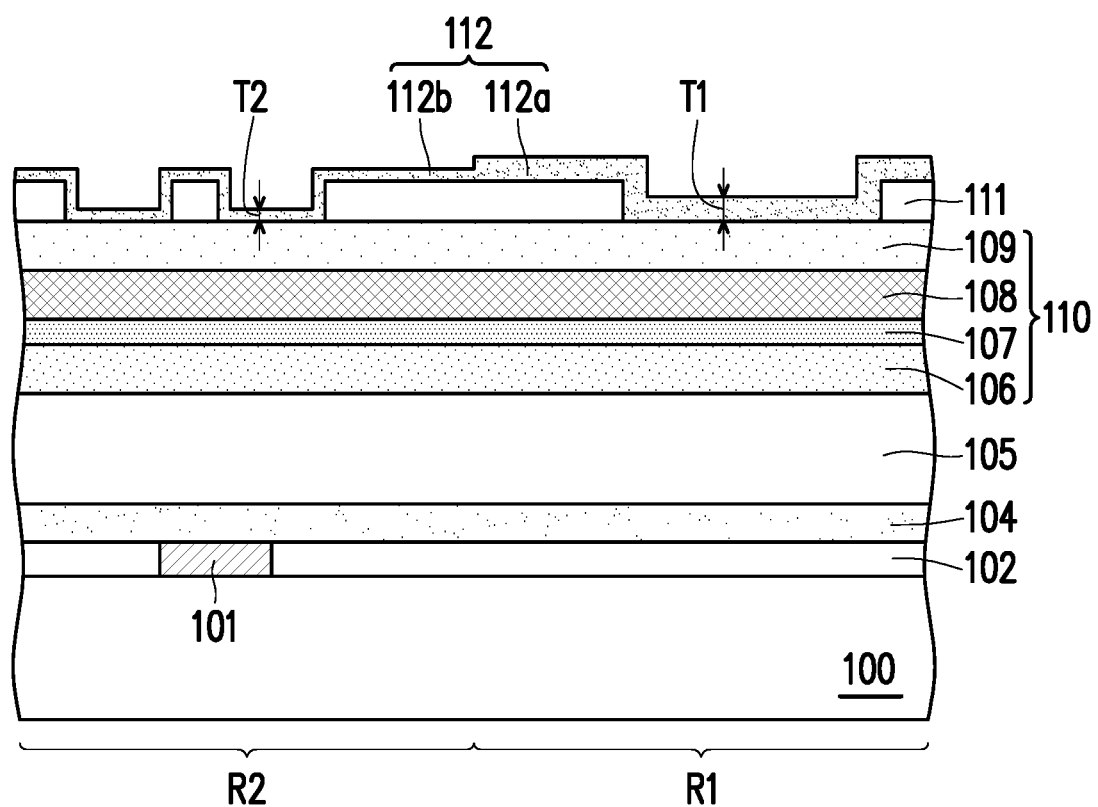
Figure 1G:
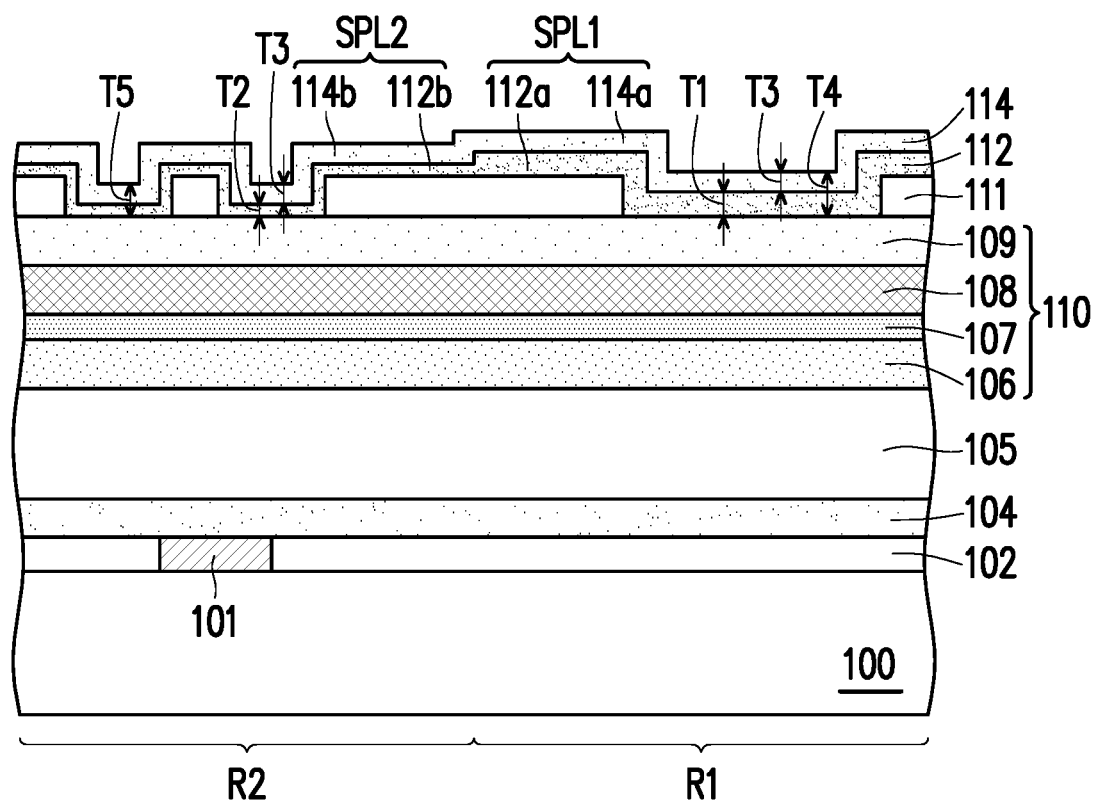
Figure 1H:
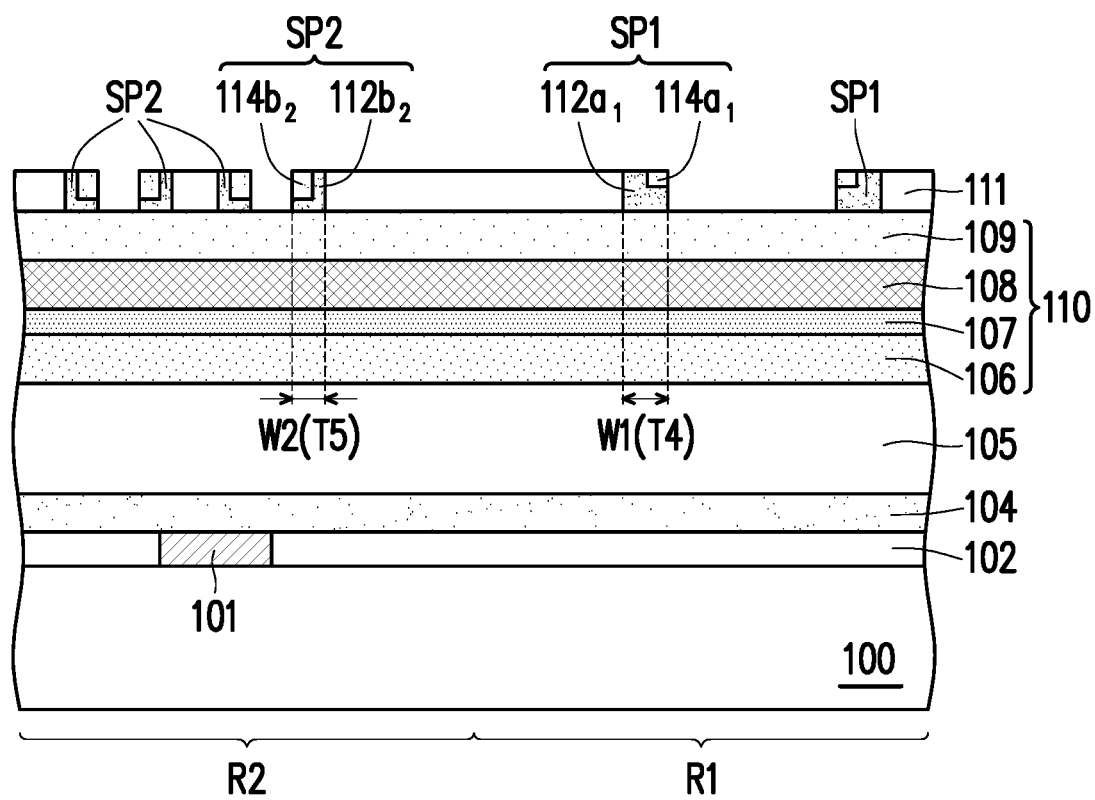
Figure 1I:
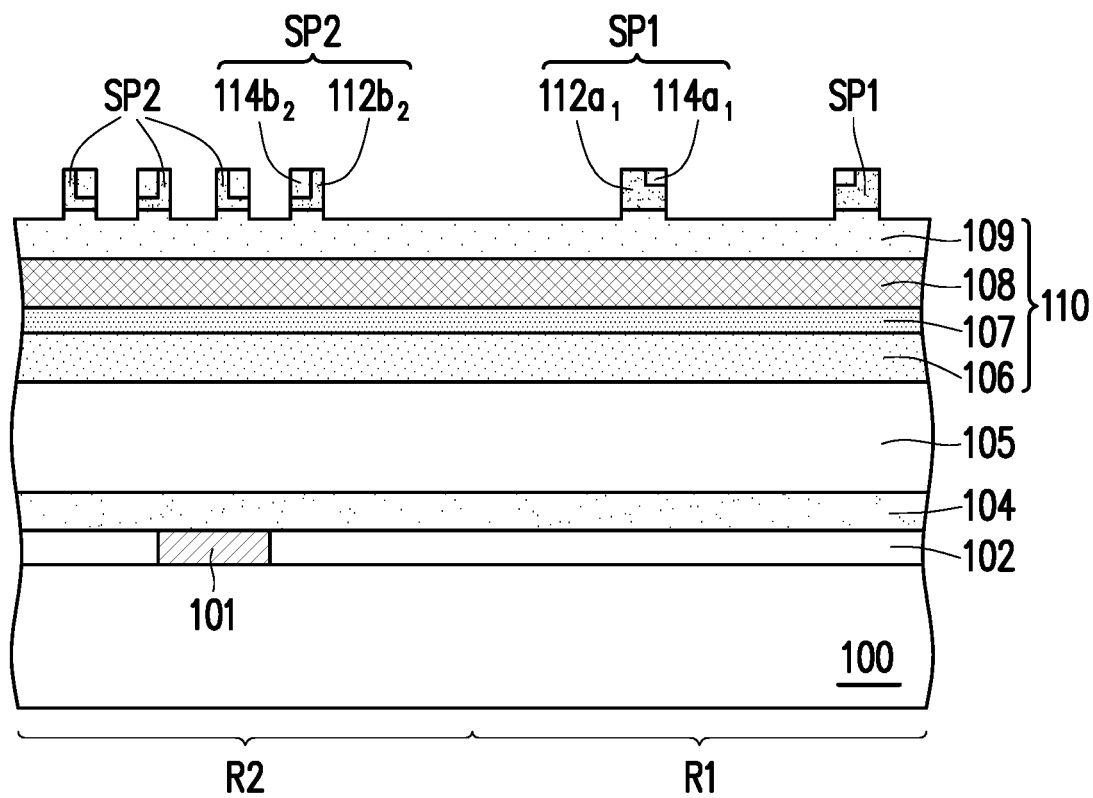
Figure 1J:
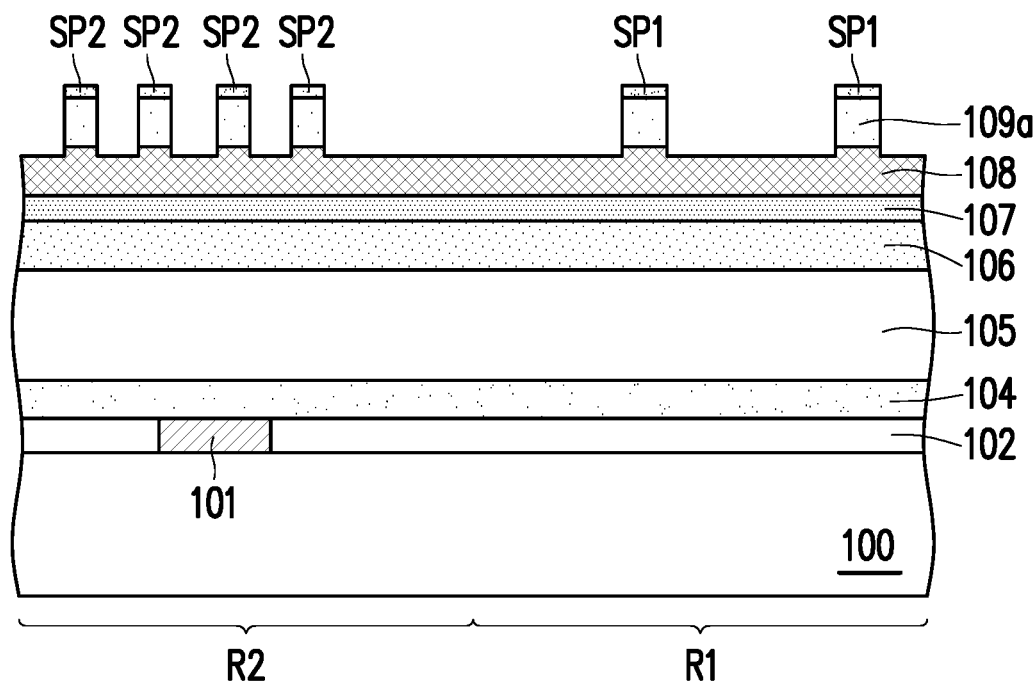
Figure 1K:
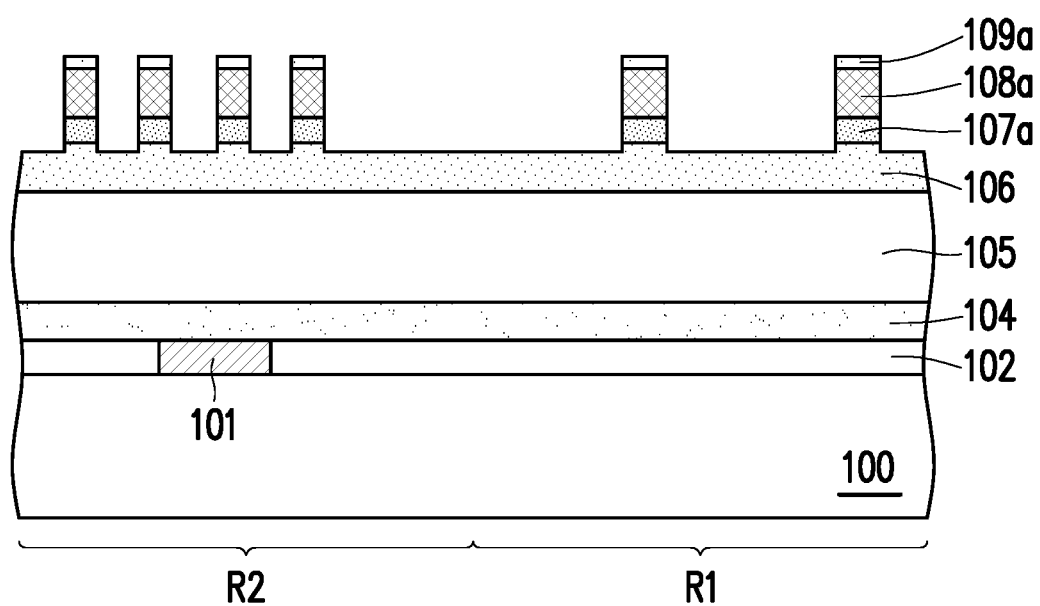
Figure 1L:
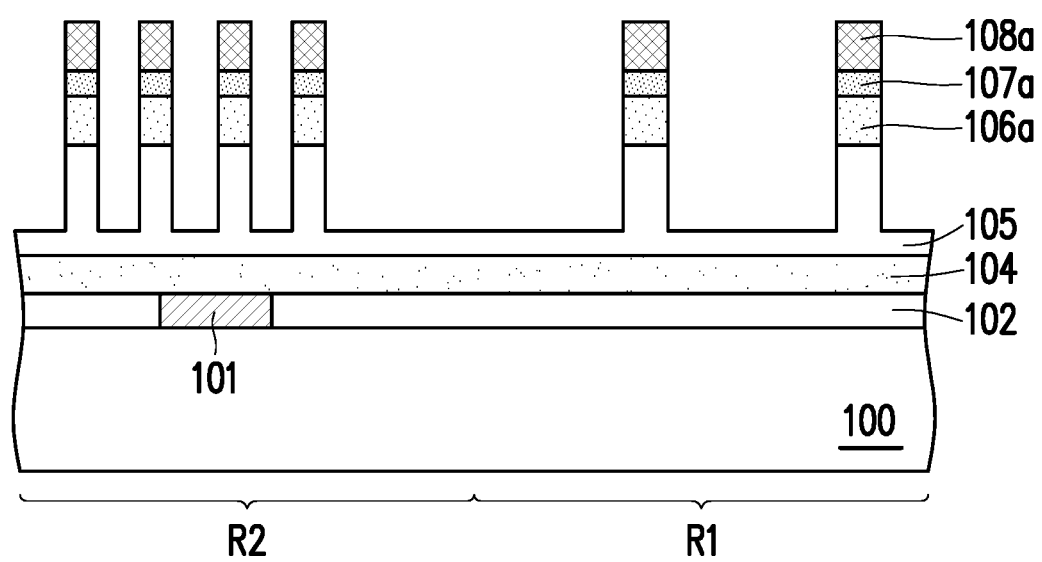
Figure 1M:
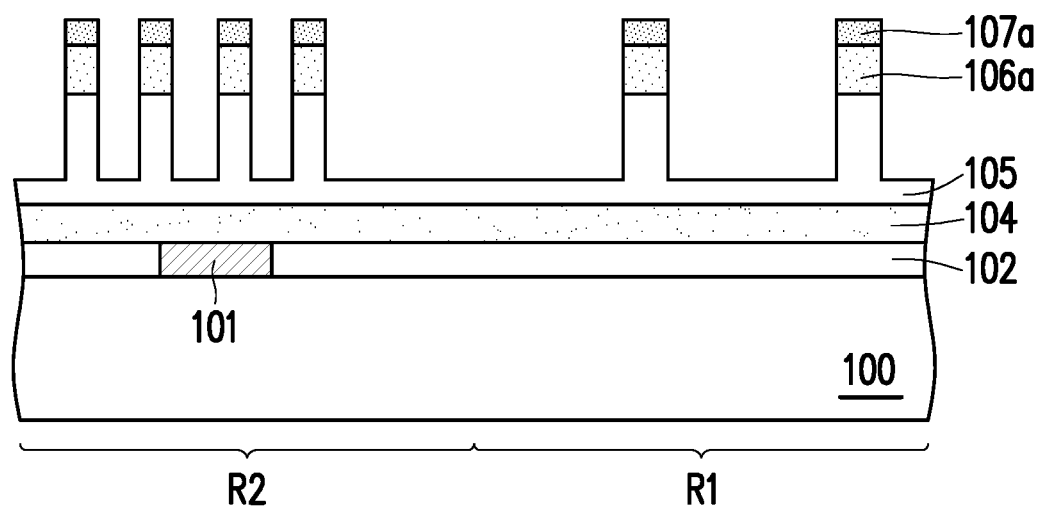
Figure 1N:
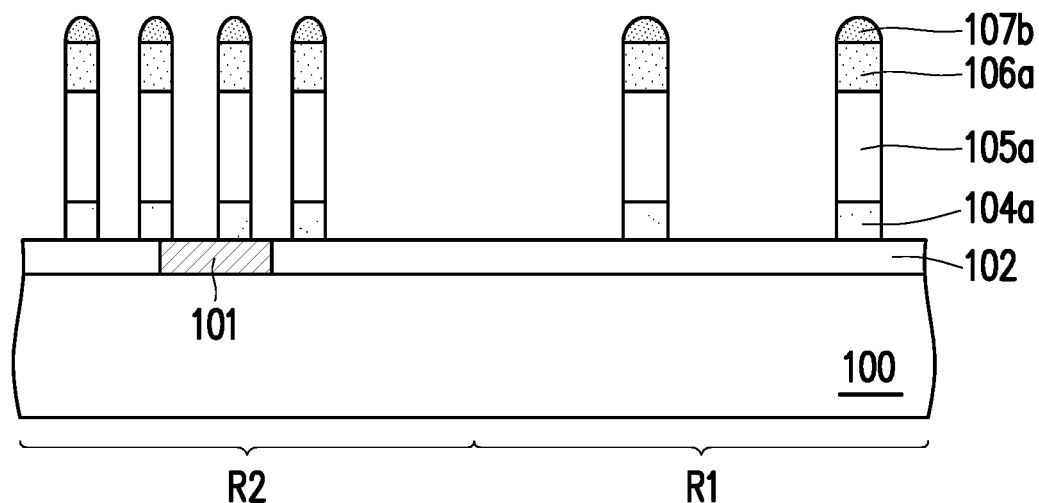
Figure 1O:
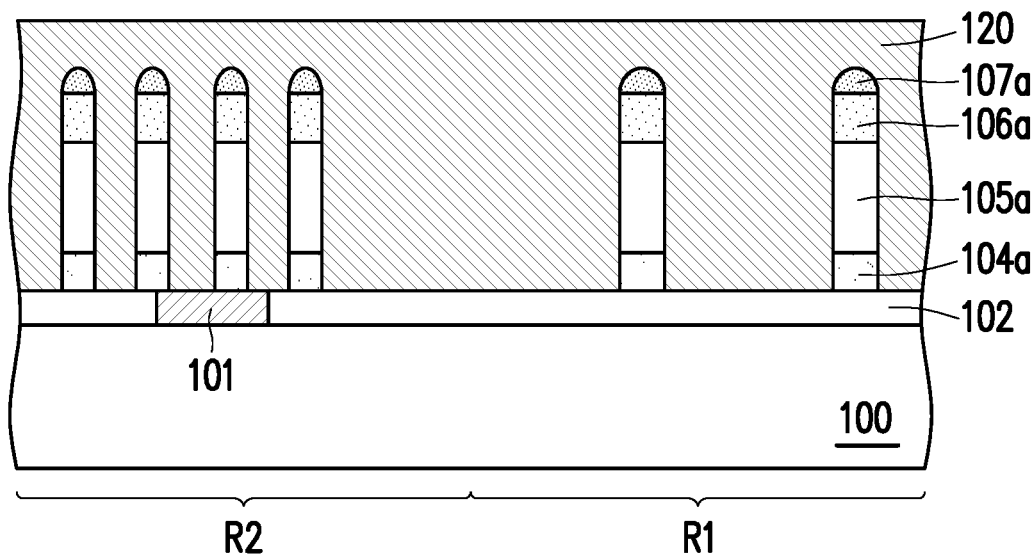
Figure 1P:
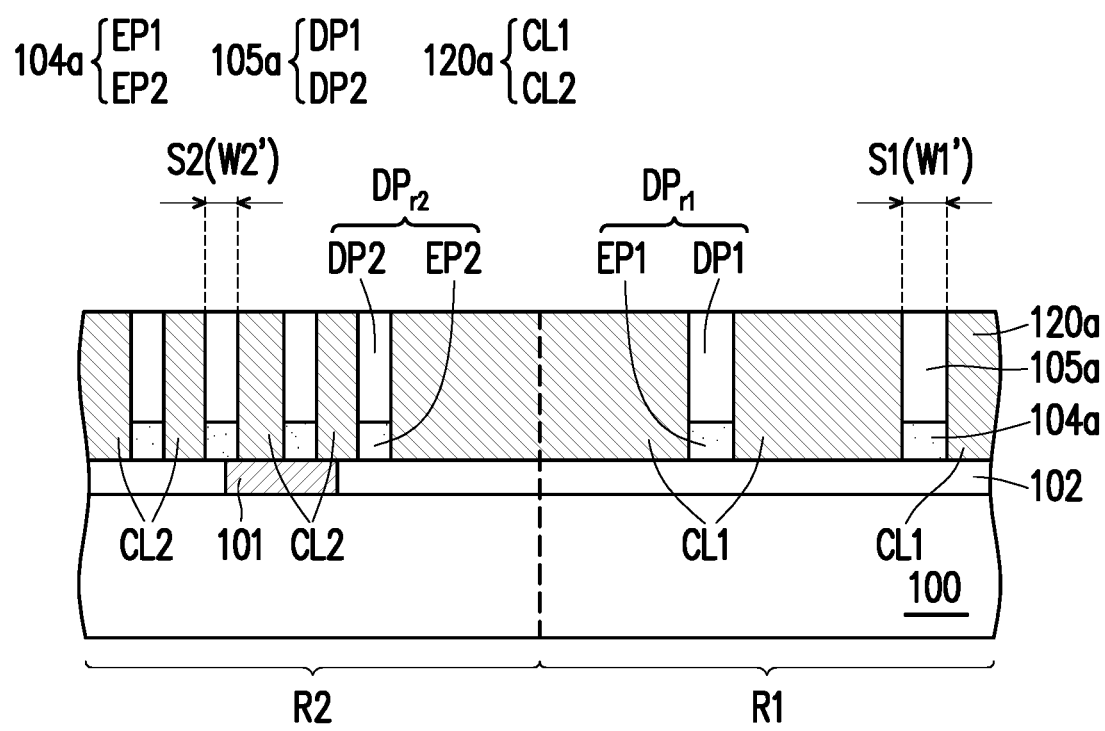

FIG. 1A to FIG. 1P are cross-sectional views illustrating a method of forming a semiconductor structure according to some embodiments of the disclosure.

Referring to FIG. 1A, a substrate 100 is provided, the substrate 100 is a semiconductor substrate, such as a bulk semiconductor substrate, a semiconductor-on-insulator (SOI) substrate, or the like, which may be doped (e.g., with a p-type or an n-type dopant) or undoped. The substrate 100 may be a semiconductor wafer, such as a silicon wafer. Other substrates, such as a multi-layered or gradient substrate may also be used. In some embodiments, the semiconductor material of the substrate 100 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

A plurality of devices (not shown) may be formed in and/or on the substrate 100. The devices may include active devices, passive devices, or combinations thereof. For example, the devices may include transistors, memories, capacitors, resistors, diodes, photodiodes, fuse devices, or the like, or combinations thereof.

One or more contact 101 may be formed over the substrate 100. The contact 101 may be embedded in a dielectric layer 102 and electrically connected to the various devices. The contact 101 includes a suitable conductive material such as metal, metal alloy, the like or combinations thereof. In some embodiments, the contact 101 includes a barrier layer and a conductive layer on the barrier layer. The barrier layer may surround sidewalls and/or bottom surface of the conductive layer. The barrier layer may include titanium, tantalum, titanium nitride, tantalum nitride, manganese nitride or combinations thereof. The conductive layer may include metal, such as tungsten (W), copper (Cu), Ru, Ir, Ni, Os, Rh, Al, Mo, Co, alloys thereof, combinations thereof or any suitable metallic material. The dielectric layer 102 includes any suitable dielectric material such as silicon oxide, a low-k dielectric material, or the like, or combinations thereof.

In some embodiments, an etching stop layer 104 and a dielectric layer 105 are formed over the substrate 100. The dielectric layer 105 may also be referred to as an interlayer dielectric (ILD) layer or inter-metal dielectric (IMD) layer. The etching stop layer 104 and the dielectric layer 105 are formed of different material by suitable deposition processes. For example, the etching stop layer 104 includes SiN, SiC, SiOC, SiON, SiCN, SiOCN, or the like, or combinations thereof. The etching stop layer 104 may be formed by CVD, plasma-enhanced CVD (PECVD), ALD or the like. In some embodiments, the dielectric layer 105 includes silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 105 may include low-k dielectric material with a dielectric constant lower than 4, extreme low-k (ELK) dielectric material with a dielectric constant lower than 2.5. In some embodiments, the low-k material includes a polymer based material, such as benzocyclobutene (BCB), FLARE®, or SILK®; or a silicon dioxide based material, such as hydrogen silsesquioxane (HSQ) or SiOF. The dielectric layer 105 may be a single layer structure or a multi-layer structure. The dielectric layer 105 may be formed by CVD, PECVD, FCVD, spin coating or the like.

Still referring to FIG. 1A, a hard mask structure 110 is then formed on the dielectric layer 105. The hard mask structure 110 may include any suitable hard mask material, including oxides and/or nitrides, such as silicon oxide, silicon nitride, silicon oxynitride, titanium oxide, titanium nitride (TiN), SiOC, tetraethosiloxane tetraethyl orthosilicate (TEOS), or the like or combinations thereof. The hard mask layer 110 may be formed by any suitable method, including CVD, PECVD, ALD, PVD or the like, or combinations thereof.

The hard mask structure 110 may be a single-layer structure or a multi-layer structure. In some embodiments, the hard mask structure 110 is a multi-layer structure including a first hard mask layer 106, a second hard mask layer 107, a third hard mask layer 108 and a fourth hard mark layer 109 stacked on one another. The materials and thicknesses of the hard mask layers 106-109 may be the same or different. For example, the first hard mask layer 106 has a thickness ranging from 50 angstrom (Å) to 500 Å, such as 270 Å; the second hard mask layer 107 has a thickness ranging from 0 Å to 500 Å, such as 70 Å; the third hard mask layer 108 has a thickness ranging from 50 Å to 500 Å, such as 200 Å; and the fourth hard mask layer 109 has a thickness ranging from 50 Å to 500 Å, such as 230 Å. However, the disclosure is not limited thereto. In an example, the first hard mask layer 106 includes TEOS, the second hard mask layer 107 includes nitrogen free anti-reflection layer (NFARL), the third hard mask layer 108 includes TiN, and the fourth hard mask layer 109 include TEOS. However, the disclosure is not limited thereto. The hard mask structure 110 may include any suitable number of hard mask layers, and each of the hard mask layers may be formed of any suitable hard mask material.

A plurality of mandrel patterns 111 are formed on the hard mask structure 110. The mandrel patterns 111 are spaced from each other and expose portions of the top surface of the hard mask structure 110. In some embodiments, the mandrel patterns 111 may be formed of amorphous silicon, amorphous carbon, polysilicon, or any other suitable material. The mandrel patterns 111 may be formed by a suitable deposition process followed by a patterning process.

For example, a mandrel layer may be formed on the hard mask structure 110 by a suitable deposition process such as CVD, PECVD, or the like. A patterned mask layer is formed on the mandrel layer for defining the mandrel patterns. The patterned mask layer includes a plurality of openings exposing portions of the mandrel layer. The patterned mask layer may include patterned photoresist formed by lithography process. Thereafter, the mandrel layer is patterned using the patterned mask layer. For example, an etching process is performed using the patterned mask layer as an etching mask, so as to remove portions of the mandrel layer exposed by the patterned mask layer. The patterned mask layer is then removed.

Still referring to FIG. 1A, a spacer layer (or referred to as a first spacer layer) 112 is then formed to cover the mandrel patterns 111. The first spacer layer 112 may include titanium oxide (TiO), titanium nitride (TiN), aluminum oxide, silicon nitride, silicon oxynitride, silicon oxycarbide, silicon carbonitride, or the like, or combinations thereof. The first spacer layer 112 may be formed using a suitable deposition process, such as atomic layer deposition (ALD), CVD, low pressure CVD, and the like. In some embodiments, the first spacer layer 112 is a conformal layer. Herein, when a layer is described as a "conformal layer", it means the layer has a uniform thickness, that is, has a substantially equal thickness extending along the region on which the layer is formed. In other words, the first spacer layer 112 is conformally formed on the top surfaces and sidewalls of the mandrel patterns 111 and on the top surface of the hard mask structure 110 exposed by the mandrel patterns 111. In some embodiments, the first spacer layer 112 has a uniform thickness T1. The thickness T1 of the first spacer layer 112 may range from 30 Å to 300 Å, for example.

Referring to FIG. 1B, a mask layer 113 is formed over the substrate 100 to cover the first spacer layer 112. The mask layer 113 may be a single-layer structure, a bilayer structure, a tri-layer structure or a multi-layer structure including more than three layers. In some embodiments, the mask layer 113 is a bilayer structure including a bottom layer 113a and a top layer 113b on the bottom layer 113a. The bottom layer 113a may include a material that is patternable and/or have a composition tuned to provide anti-reflection properties. In some embodiments, the bottom layer 113a includes a carbon rich material, such as carbon backbone polymers, spin-on carbon (SOC) based film, or the like; a silicon containing material, or combinations thereof. The top layer 113b may be a photoresist layer. The bottom layer 113a and the top layer 113b may be formed by spin coating process(es) and/or suitable deposition processes.

Referring to FIG. 1C and FIG. 1D, the mask layer 113 is patterned to form a patterned mask layer 113'. In some embodiments, the top layer 113b is firstly patterned by a photolithograph process, so as to form a patterned top layer 113b'. Thereafter, the pattern of the patterned top layer 113b' is transferred into the bottom layer 113a, so as to form a patterned bottom layer 113a'. In some embodiments, the pattern transfer includes performing an etching process using the patterned top layer 113b' as an etching mask, so as to remove the portion of the bottom layer 113a not covered by the patterned top layer 113b', thereby forming the patterned bottom layer 113a'. In some embodiments, the patterned top layer 113b' may be consumed (e.g., completely consumed) during the etching process, and the pattered bottom layer 113a' serves as the patterned mask 113' for the subsequent etching process, but the disclosure is not limited thereto. In alternative embodiments, the patterned top layer 113b' may be partially consumed, and the remained portion of the patterned top layer 113b' and the patterned bottom layer 113a' constitute the patterned mask layer 113'.

As shown in FIG. 1D, in some embodiments, the patterned mask layer 113' partially covers the first spacer layer 112 and exposes a portion of the first spacer layer 112. For example, the patterned mask 113' covers a first part of the first spacer layer 112 within a first region R1 and exposes a second part of the first spacer layer 112 within a second region R2. In other words, the patterned mask layer 113' has an opening OP exposing a portion of the first spacer layer 112 within the second region R2.

Referring to FIG. 1E and FIG. 1F, a trimming process is performed to thin the second part of the first spacer layer 112. The trimming process may also be referred to as a thinning process. In some embodiments, the trimming process may be performed as follows: an etching process is performed using the patterned mask layer 113' as an etching mask to remove a portion of the first spacer layer 112 in the second region R2, such that the thickness of the first spacer layer 112 in the second region R2 is reduced. The patterned mask 113' is then removed by an ashing or a stripping process, for example.

Referring to FIG. 1F, in some embodiments, the thickness of the first spacer layer 112 in the second region R2 is reduced from T1 to T2. In other words, after the etching process is performed, the first spacer layer 112 includes a first portion 112a within the first region R1 and a second portion 112b within the second region R2. The thickness T1 of the first portion 112a is larger than the thickness T2 of the second portion 112b. In some embodiments, the first spacer layer 112 in the second region 112b may be completely removed by the etching process, and after the etching process, only the first portion of the spacer layer 112a remains in the first region R1, and there is free of spacer layer in the second region R2. That is, the thickness T2 may be zero. In some embodiments, the thickness T2 of the second portion 112b of the first spacer layer 112 may range from 0 Å to 270 Å, for example. In some embodiments, after the trimming process is performed, the first spacer layer 112 may be referred to as a partially trimmed or thinned first spacer layer which has non-uniform thickness within the first region R1 and the second region R2.

Referring to FIG. 1G, in some embodiments, a second spacer layer 114 is then formed on the first spacer layer 112. The material and forming method of the second spacer layer 114 may be selected from the same candidate materials and forming methods of the first spacer layer 112. The material of the second spacer layer 114 may be the same as or different from that of the first spacer layer 112. In some embodiments, the second spacer layer 114 is a conformal layer, conformally covering the first portion 112a and the second portion 112b of the first spacer layer 112. The second spacer layer 114 may have a thickness T3 the same as or different from the thickness T1 or T2 of the first spacer layer 112. For example, the thickness T3 of the second spacer layer 114 may range from 30 Å to 300 Å. In other words, the second spacer layer 114 includes a first portion 114a on the first portion 112a of the first spacer layer 112 within the first region R1 and a second portion 114b on the second portion 112b of the first spacer layer 112 within the second region R2. The thickness T3 of the first portion 114a is substantially equal to the thickness T3 of the second portion 114b. In the embodiments, since the second portion 112b is thinner than the first portion 112a, the top surface (e.g., topmost surface) of the second portion 114b of the second spacer layer 114 is lower than the top surface (e.g., topmost surface) of the first portion 114a of the second spacer layer 114.

As such, the first spacer layer 112 and the second spacer layer 114 constitute stacked spacer layer covering the hard mask structure 110 and the mandrel patterns 111. In detail, the first portion 112a of the first spacer layer 112 and the first portion 114a of the second spacer layer 114 constitute a stacked spacer layer SPL1 within the first region R1, while the second portion 112b of the first spacer layer 112 and the second portion 114b of the second spacer layer 114 constitute a stacked spacer layer SPL2 within the second region R2. The stacked spacer layer SPL1 has a thickness T4 which is a sum of the thickness T1 and the thickness T3. The stacked spacer layer SPL2 has a thickness T5 which is a sum of the thickness T2 and the thickness T3. The thickness T4 of the stacked spacer layer SPL1 in the first region R1 is larger than the thickness T5 of the stacked spacer layer SPL2 in the second region R2 because the thickness T1 is larger than the thickness T2.

Referring to FIG. 1G and FIG. 1H, an etching process (e.g., etching back process) is performed on the stacked spacer layer to form spacers SP1 and SP2 on the mandrel patterns 111. In some embodiments, the etching process removes some horizontal portions of the first spacer layer 112 and the second spacer layer 114 covering the top surface of the mandrel patterns 111 and a portion of the top surface of the hard mask structure 110, remaining the spacers SP1 and SP2 on sidewalls of the mandrel patterns 111. The etching process may include an anisotropic etching process using an etchant which has a high selectivity ratio of the stacked spacer layer to the mandrel patterns 111 and the hard mask structure 110. After the stacked spacer layer is etched back to form the spacers SP1 and SP2, the top surfaces of the mandrel patterns 111 and portions of the top surface of the hard mask structure 110 are exposed. In some embodiments, the top surfaces of the spacers SP1, SP2 and the mandrel patterns 111 may be substantially coplanar with each other.

Referring to FIG. 1H, the spacers SP1 are formed on sidewalls of the mandrel patterns 111 within the first region R1, and the spacers SP2 are formed on sidewalls of the mandrel patterns 111 within the second region R2. The spacers SP1 and SP2 are formed from the stacked spacer layers SPL1 and SPL2 with different thicknesses, respectively. As such, the spacer SP1 has a width W1 larger than a width W2 of the spacer SP2. The width W1 of the spacer SP1 may be substantially equal to the thickness T4 of the stacked spacer layer SPL1, and the width W2 of the spacer SP2 may be substantially equal to the thickness T5 of the stacked spacer layer SPL2.

In some embodiments, the spacer SP1 includes a first spacer portion $112a_1$ formed from the first portion 112a of the first spacer layer 112 and a second spacer portion $114a_1$ formed from the first portion 114a of the second spacer layer 114. Similarly, the spacer SP2 includes a first spacer portion $112b_2$ formed from the second portion 112b of the first spacer layer 112 and a second spacer portion $114b_2$ formed from the second portion 114b of the second spacer layer 114. In some embodiments, each of the first spacer portions $112a_1$ and $112b_2$ are L-shaped or the like, and each of the second spacer portions $114a_1$ and $114b_2$ may be square or rectangular shaped or the like. In some embodiments, the first spacer portion $112a_1$ is thicker and wider than the first spacer portion $112b_2$. The width of the second portion $114a_1$ may be substantially equal to the width of the second portion $114b_2$, while the height of the second portion $114a_1$ may be less than the height of the second portion $114b_2$. The bottom surface of the second portion $114a_1$ may be higher than the bottom surface of the second portion $114b_2$.

In the illustrated embodiments, two spacer layers are used as a spacer material layer to form the spacers, and the first spacer layer is partially thinned such that the resulted spacers have different widths. However, the disclosure is not limited thereto. The spacer material layer may be deposited and partially thinned in other suitable deposition and removal way, as long as the resulted spacers have different widths. For example, in some alternative embodiments, the first spacer layer 112 may be not partially thinned and has uniform thickness, while the second spacer layer 114 is partially thinned to have different thicknesses in different regions R1 and R2. In such embodiments, a portion of the second spacer layer 114 in the second region R2 may be thinned, such that the spacer SP1 is wider than the spacer SP2. Accordingly, the first spacer portion $112a_1$ may have substantially the same thickness as the first spacer portion $112b_2$, while the second spacer portion $114a_1$ may be wider than the second portion $114b_2$, and the bottom surface of the second spacer portion $114a_1$ may be substantially coplanar with the bottom surface of the second spacer portion $114b_2$.

In yet another embodiment, one spacer layer may be used to form the spacers having different widths. For example, the one spacer layer is partially thinned to have different thicknesses and then etched back to form spacers having different widths. In some other embodiments, more than two spacer layers may be used to form the spacers having different widths.

Referring to FIG. 1H and FIG. 1I, the mandrel patterns 111 are then removed by a suitable removal process. In some embodiments, the removal process includes photolithograph and etching processes. For example, a patterned mask including a patterned photoresist may be formed over the substrate 100 to cover the hard mask structure 110 and the spacers SP1, SP2. The formation of the patterned mask includes a photolithograph process. The patterned mask has openings directly over and exposing the mandrel patterns 111. The mandrel patterns 111 are then removed by an etching process using the patterned mask as an etching mask. The etching process may include wet etching process, anisotropic dry etching process, or combinations thereof. In some embodiments, the etching process includes a dry etching using etch process gases including $O_2$, $CO_2$, $C_xH_yF_z$, Ar, $N_2$, $H_2$, HBr, $Cl_2$, and combinations thereof. In some other embodiments, the mandrel patterns 111 are removed by an oxygen-plasma ashing process. Subsequently, a wet clean process may be applied to remove residual mandrel material. Other suitable removal process may also be used. In some embodiments, a portion of the fourth hard mask layer 109 uncovered by the spacers SP1 and SP2 may also be removed when removing the mandrel patterns 111, but the disclosure is not limited thereto.

Referring to FIG. 1I, the spacers SP1 and SP2 constitute a spacer mask SP which has the pattern for defining the dielectric layer 105 in subsequent processes. Referring to FIG. 1I to FIG. 1O, a pattering process is then performed to sequentially transfer the pattern of the spacer mask SP into the hard mask structure 110, the dielectric layer 105 and the etching stop layer 104. In some embodiments, the hard mask structure 110, the dielectric layer 105 and the etching stop layer 104 are patterned by one or more etching process(es) using the spacer mask SP and/or the patterned layer underlying the spacer mask SP as the etching mask. The etching processes may include dry etching, wet etching, or a combination thereof. In some embodiments, the etching processes include anisotropic etching processes. An illustrative patterning process is described as below.

Referring to FIG. 1I and FIG. 1J, in some embodiments, the fourth hard mask layer 109 is firstly patterned by an etching process using the spacer mask SP as an etching mask, such that the pattern of the spacer mask SP is transferred into the fourth hard mask layer 109, thereby forming a patterned hard mask 109a. In some embodiments, the spacer mask SP may be partially consumed when patterning the fourth hard mask layer 109.

Referring to FIG. 1J and FIG. 1K, the third hard mask layer 108 and the second hard mask layer 107 are then patterned by etching process(es) using the spacer mask SP and the patterned hard mask 109a as the etching mask, such that the pattern of the spacer mask SP is transferred into the third hard mask layer 108 and the second hard mask layer 107, thereby forming a patterned hard mask 108a and a patterned hard mask 107a. In some embodiments, the spacer mask SP is further consumed and the patterned hard mask 109a may also be partially consumed when patterning the third hard mask layer 108 and the second hard mask layer 107.

Referring to FIG. 1K and FIG. 1L, the first hard mask layer 106 and/or a portion of the dielectric layer 105 are then patterned by etching process(es) using the patterned hard masks 109a, 108a and 107a as the etching mask, such that the pattern is transferred into the first hard mask layer 106 and/or a portion of the dielectric layer 105, thereby forming a patterned hard mask 106a. In some embodiments, the patterned hard mask 109a is further consumed and may be completely removed during the patterning of the first hard mask layer 106 and/or the dielectric layer 105. In some embodiments, the etching process is performed until the top surface of the patterned hard mask 108a is exposed.

Referring to FIG. 1L and FIG. 1M, in some embodiments, the patterned hard mask 108a includes metallic material, and may be removed before performing further patterning process. The patterned hard 108a may be removed by a suitable etching process, such as wet etching, dry etching, or the like, a combination thereof or any other suitable removal process. In some embodiments, the etching process has a high etching selectivity ratio of the patterned hard mask 108a to other layers (including the patterned mask layers 107a, 106a and the dielectric layer 105), and the other layers may be substantially not removed during the etching of the patterned hard mask 108a.

Referring to FIG. 1M and FIG. 1N, the patterning process is continued to transfer the pattern into the un-patterned portion of the dielectric layer 105 and the etching stop layer 104. In some embodiments, the dielectric layer 105 and the etching stop layer 104 are patterned by etching process(es) using the patterned hard masks 107a and 106a as the etching mask, thereby forming a dielectric layer (or referred to as a patterned dielectric layer) 105a and an etching stop layer (or referred to as a patterned etching stop layer) 104a. In some embodiments, the patterned hard mask 107a is partially consumed when patterning the dielectric layer 105 and the etching stop layer 104, and a patterned hard mask 107b may be formed. The patterned hard mask 107b may have rounded surface.

Referring to FIG. 1O, a conductive material layer 120 is then formed over the substrate 100 to cover the patterned hard masks 107b, 106a, the dielectric layer 105a and the etching stop layer 104a. The conductive material 120 may include metal or metal alloy, such as tungsten (W), copper (Cu), Ru, Ir, Ni, Os, Rh, Al, Mo, Co, alloys thereof, combinations thereof or other suitable metallic material. In some embodiments, a barrier material layer (not shown) may be formed over the substrate 100 before forming the conductive material layer 120. The barrier layer 109 may include titanium, tantalum, titanium nitride, tantalum nitride, manganese nitride or combinations thereof.

Referring to FIG. 1O and FIG. 1P, a planarization process is performed to remove excess portions conductive material layer 120 and the patterned hard masks 107b, 106b over the top surface of the patterned dielectric layer 105a, and a conductive layer 120a is formed laterally aside the patterned dielectric layer 105a. In some embodiments, the top surface of the conductive layer 120a is substantially coplanar with the top surface of the dielectric layer 105a.

Referring to FIG. 1P, a semiconductor structure 10 is thus formed. In some embodiments, the semiconductor structure 10 includes the substrate 100, the contact 101 electrically connected to devices formed on and/or in the substrate 100, the etching stop layer 104a and the dielectric layer 105a formed over the substrate 100, and the conductive layer 120a. In some embodiments, the conductive layer 120a penetrates through the dielectric layer 105a and the etching stop layer 104a to electrically connect to the contact 101.

In some embodiments, the dielectric layer 105a and the etching stop layer 104a includes a plurality of dielectric portions DP1 and etching stop portions EP1 within the first region R1 and a plurality of dielectric portions DP2 and etching stop portions EP2 within the second region R2, which are defined by the spacers SP1 and SP2 (FIG. 1I), respectively. The widths W1' of the dielectric portion DP1 and the etching stop portion EP1 are defined by and may be substantially the same as the width W1 of the spacer SP1, while the widths W2' of the dielectric portion DP2 and the etching stop portion EP2 are defined by and may be substantially the same as the width W2 of the spacer SP2. In some embodiments, the dielectric portions DP1 and the corresponding etching stop portions EP1 underlying thereof constitute a plurality of dielectric patterns $DP_{r1}$ arranged within the region R1, while the dielectric portions DP2 and the corresponding etching stop portions EP2 underlying thereof constitute a plurality of dielectric patterns $DP_{r2}$ arranged within the region R2. Accordingly, the width W1' of the dielectric pattern $DP_{r1}$ is larger than the width W2' of the dielectric portion $DP_{r2}$. In some alternative embodiments, the etching stop layer 104a is optionally formed and may be omitted, and the dielectric patterns $DP_{r1}/DP_{r2}$ may merely include the dielectric portions DP1 and DP2 and free of the etching stop portions. In some embodiments, the widths of the dielectric patterns $DP_{r1}$ and $DP_{r2}$ are used to define the spacings between conductive lines of the conductive layer 120a.

Figure 2:
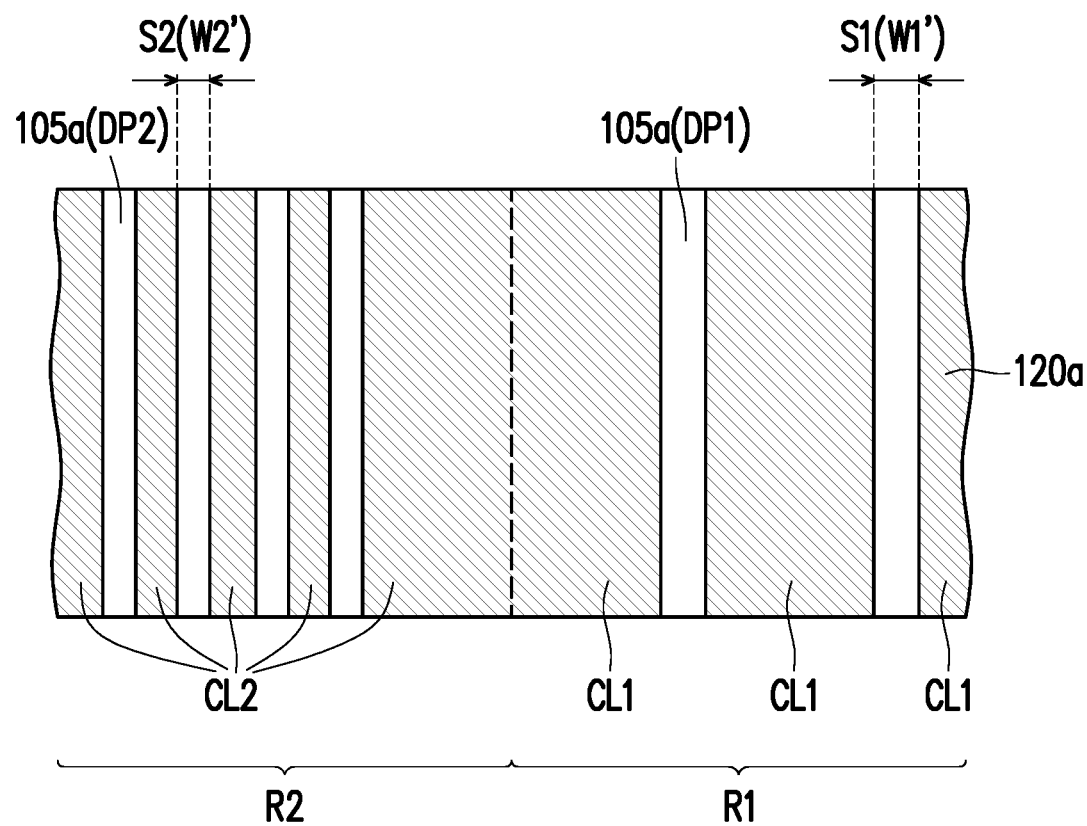
FIG. 2 is a top view of a semiconductor structure illustrating a layout of conductive lines according to some embodiments of the disclosure.

FIG. 2 illustrates a layout or a top view of the semiconductor structure 10 illustrating the configuration of the conductive layer 105a. Referring to FIG. 1P and FIG. 2, in some embodiments, the conductive layer 120a includes a plurality of conductive lines CL1 within the region R1 and a plurality of conductive lines CL2 within the region R2. The conductive lines CL1 and CL2 are embedded in the dielectric layer 105a and the etching stop layer 104a and spaced from each other by the dielectric layer 105a and the etching stop layer 104a therebetween. In detail, the conductive lines CL1 are spaced apart from each other by the dielectric patterns $DP_{r1}$ therebetween, and the conductive lines CL2 are spaced apart from each other by the dielectric patterns $DP_{r2}$ therebetween. The spacing S1 laterally between two adjacent conductive lines CL1 is defined by and substantially equal to the width W1' of the dielectric pattern $DP_{r1}$, and the spacing S2 laterally between two adjacent conductive lines CL2 is defined by and substantially equal to the width W2' of the dielectric pattern $DP_{r2}$. In other words, the spacing S1 and the spacing S2 are defined by the width W1 of the spacer SP1 and the width W2 of the spacer SP2, respectively. As such, the spacing S1 between the conductive lines CL1 is larger than the spacing S2 between the conductive lines CL2. In some embodiments, the spacing S1 may range from 6 nm to 40 nm, such as 17 nm, and the spacing S2 may range from 3 nm to 37 nm, such as 14 nm, the ratio of the spacing S2 to the spacing S1 may range from 0.075 to 0.925, such as about 0.5 or about 0.8, but the disclosure is not limited thereto. Herein, the "spacing" between the conductive lines refers to the lateral distance between two adjacent conducive lines in a direction parallel with a top surface of the substrate 100. In some embodiments, the larger spacing between the conductive lines CL1 result in reduced capacitance between the conductive lines CL1. That is, the capacitance between the conductive lines CL1 may be less than the capacitance between the conductive lines CL2.

In other words, the semiconductor structure 10 includes a region R1 and a region R2, in which the conductive lines CL1 and conductive lines CL2 in a same conductive layer 120a are formed to have different spacings between two adjacent conductive lines.

In some embodiments, the conductive lines CL1 and CL2 of the conductive layer 120a may be the first tier of conductive lines included in an interconnection structure formed over the substrate 100, but the disclosure is not limited thereto. The interconnection structure is disposed to electrically connect the various devices in and/or on the substrate 100 to form a functional circuit. The interconnection structure may include a plurality of conductive features embedded in a dielectric structure. The dielectric structure may include a plurality of dielectric layers and/or etching stop layers. The conductive features may include multi-layers of conductive lines and conductive vias interconnected to each other.

Although the embodiments illustrates the formation of the conductive lines CL1 and CL2 on the contact 101, the concept of the embodiments may be applied in the formation of conductive lines in any suitable tier of the interconnection structure. For example, in some embodiments, the contact 101 is replaced by a conducive via, the conductive lines CL1 and CL2 are M+1 (M≥0) tier of the conductive lines included in the interconnection structure, and the conductive lines CL1 and CL2 are connected to M tier of the conductive lines which is underlying the conductive via through the conductive via. In some embodiments, the concept of the embodiments may also be applied in the formation of conductive lines (such as redistribution layers) in other kind of semiconductor structure, such as package structure.

In the foregoing embodiments, conductive lines having two types of spaces are formed, but the disclosure is not limited thereto. In some embodiments, the spacer material layer is formed to have different thicknesses in more than two regions, and multiple (e.g., more than two) groups of spacers are formed to have different widths, thereby defining multiple (e.g., more than two) spacings between the conductive lines in a same conductive layer. A method for forming conductive lines have three different spacings is described as below for illustration.

For example, after the mandrel patterns 111 are formed, a first spacer layer is conformally formed to cover the mandrel patterns 110. A first patterned mask is formed to cover portions of the first spacer layer within a first region and a second region and expose a portion of the first spacer layer within a third region. Thereafter, a trimming process is performed to thin the portion of the first spacer layer within the third region exposed by the first patterned mask. As such, the first spacer layer within the first and second regions is thicker than the first spacer layer within the third region. The first patterned mask is then removed. A second spacer layer is then conformally formed on the trimmed first spacer layer. In some embodiments, a second patterned mask is formed to cover a portion of the second spacer layer within the first region and expose portions of the second spacer layer within the second region and the third region, and a trimming process is performed to thin the portions of the second spacer layer within the second region and the third region exposed by the second patterned mask. As such, the second spacer layer within the first region is formed to be thicker than the second spacer layer within the second region and the third region. Thereafter, a third spacer layer may be optionally and conformally formed on the trimmed second spacer layer. As a result, the trimmed first spacer layer, the trimmed second spacer layer and the optional third spacer layer constitute a stacked spacer layer having different thicknesses in first to third regions. The stacked spacer layer may have a first thickness within the first region which is thicker than a second thickness of the stacked spacer layer within the second region, and the second thickness may be thicker than a third thickness of the stacked spacer layer within the third region. Afterwards, the stacked spacer layer is etched back to form spacers having different widths on sidewalls of the mandrel patterns. In some embodiments, the spacer within the first region may be wider than the spacer within the second region, and the spacer within the second region is wider than the spacer within the third region. Thereafter, the dielectric layer is patterned using the spacers as patterning mask, such that the patterns of the spacers are transferred into the dielectric layer. Conductive lines are then formed laterally aside the patterned dielectric layer. Accordingly, the conductive lines are formed to have different spacings within the first to third regions, which are defined by the different widths of the spacers.

In the embodiments of the disclosure, the spacer layer is partially trimmed to form a spacer material layer having different thicknesses in different regions, thereby forming spacers having different widths in different regions for defining spacing between conductive lines. As such, multiple choices of spacing are provided for the conductive lines, and the layout design may be more flexible. In some embodiments, the capacitance between the conductive lines having larger spacing is reduced, and device performance may be improved.

In accordance with some embodiments of the disclosure, a method of forming a semiconductor structure includes: forming a plurality of mandrel patterns over a dielectric layer; forming a first spacer and a second spacer on sidewalls of the plurality of mandrel patterns, wherein a first width of the first spacer is larger than a second width of the second spacer; removing the plurality of mandrel patterns; patterning the dielectric layer using the first spacer and the second spacer as a patterning mask; and forming conductive lines laterally aside the dielectric layer.

In accordance with alternative embodiments of the disclosure, a method of forming a semiconductor structure includes: forming a dielectric layer over a semiconductor substrate; forming a hard mask structure on the dielectric layer; forming mandrel patterns on the hard mask structure; forming a first spacer layer to cover the mandrel patterns within a first region and a second region; thinning a portion of the first spacer layer within the second region, thereby forming a partially thinned first spacer layer; etching back the partially thinned first spacer layer to form a spacer mask on sidewalls of the mandrel patterns; removing the mandrel patterns; and patterning the hard mask structure and the dielectric layer to transfer a pattern of the spacer mask into the hard mask structure and the dielectric layer.

In accordance with some embodiments of the disclosure, a semiconductor structure includes a substrate, a dielectric layer, and a conductive layer. The dielectric layer is disposed on the substrate and includes a first dielectric portion and a second dielectric portion. The conductive layer is laterally aside the dielectric layer and includes first conductive lines and second conductive lines. The first conductive lines are spaced apart by the first dielectric portion therebetween. The second conductive lines are spaced apart by the second dielectric portion therebetween. A first spacing between the first conductive lines is different from a second spacing between the second conductive lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
   forming a plurality of mandrel patterns over a dielectric layer;
   forming a first spacer and a second spacer on sidewalls of the plurality of mandrel patterns, wherein a first width of the first spacer is larger than a second width of the second spacer, wherein the first spacer comprises a first spacer portion and a second spacer portion in contact with the first spacer portion, and the second spacer comprises a third spacer portion and a fourth spacer portion in contact with the third spacer portion, wherein the first spacer portion and the third spacer portion are derived by patterning a same layer, and the second spacer portion and the fourth spacer portion are derived by patterning another same layer, and wherein a first distance between a bottom surface of the second spacer portion and a bottom surface of the first spacer portion is larger than a second distance between a bottom surface of the fourth spacer portion and a bottom surface of the third spacer portion;
   removing the plurality of mandrel patterns;
   patterning the dielectric layer using the first spacer and the second spacer as a patterning mask; and
   forming conductive lines laterally aside the dielectric layer.

2. The method of claim 1, wherein patterning the dielectric layer comprises forming a first dielectric pattern defined by the first spacer and a second dielectric pattern defined by the second spacer.

3. The method of claim 2, wherein forming the conductive lines comprises:
   forming first conductive lines spaced apart by the first dielectric pattern therebetween; and
   forming second conductive lines spaced apart by the second dielectric pattern therebetween,
   wherein a first spacing between the first conductive lines is larger than a second spacing between the second conductive lines.

4. The method of claim 1, further comprising forming a hard mask structure between the dielectric layer and the plurality of mandrel patterns, wherein patterning the dielectric layer comprises:
   patterning the hard mask structure to transfer patterns of the first spacer and the second spacer into the hard mask structure, thereby foi ming a patterned hard mask structure; and
   transferring the patterns into the dielectric layer by etching the dielectric layer uncovered by the patterned hard mask structure.

5. The method of claim 4, wherein forming the conductive lines comprises:
   forming a conductive layer to cover the dielectric layer and the patterned hard mask structure; and
   performing a planarization process to remove excess portion of the conductive layer and the patterned hard mask structure over a top surface of the dielectric layer.

6. The method of claim 1, wherein forming the first spacer and the second spacer comprises:
   forming a spacer material layer on the plurality of mandrel patterns, wherein the spacer material layer comprises a first part having a first thickness and a second part having a second thickness less than the first thickness; and
   etching the spacer material layer to form the first spacer and the second spacer, wherein the first spacer is a remained portion of the first part of the spacer material layer, and the second spacer is a remained portion of the second part of the spacer material layer.

7. The method of claim 6, wherein forming the spacer material layer comprises:
   forming a spacer layer over the dielectric layer to cover the plurality of mandrel patterns; and
   trimming a portion of the spacer layer to reduce a thickness of the portion of the spacer layer.

8. The method of claim 1,
   wherein a width of the first spacer portion is larger than a width of the third spacer portion, and a width of the second spacer portion is substantially equal to a width of the fourth spacer portion.

9. A method of forming a semiconductor structure, comprising:
   forming a dielectric layer over a semiconductor substrate;
   forming a hard mask structure on the dielectric layer;
   forming mandrel patterns on the hard mask structure;
   forming a first spacer layer to cover the mandrel patterns within a first region and a second region, wherein the first spacer layer is made of a single material having a single-layer structure and a bottom surface of the first spacer layer is in physical contact with the hard mask structure;
   performing a thinning step by covering up a first portion of the first spacer layer within the first region, and thinning an exposed portion of the first spacer layer within the second region, thereby forming a partially thinned first spacer layer having the single-layer structure, wherein after the thinning step, the first spacer layer comprises the first portion within the first region and a second portion within the second region thinner than the first portion, and wherein both of the first portion and the second portion are made of the single-layer structure and the first portion is joined with the second portion after the thinning step;
   forming a second spacer layer on the partially thinned first spacer layer directly after the thinning step, wherein a bottom surface of the second spacer layer is physically separated from the hard mask structure;
   etching back the second spacer layer and etching back the partially thinned first spacer layer to form a spacer mask on sidewalls of the mandrel patterns, wherein the spacer mask comprises a first spacer that comprises a first spacer portion formed from the first portion of the first spacer layer and a second spacer portion formed from the second spacer layer and disposed on the first spacer portion, and a second spacer that comprises a third spacer portion formed from the second portion of the first spacer layer and a fourth spacer portion formed from the second spacer layer and disposed on the third spacer portion, wherein the first spacer is wider than the second spacer, and a bottom surface of the second spacer portion and a bottom surface of the fourth spacer portion are located at different levels with a bottom surface of the first spacer portion and a bottom surface of the third spacer portion;
   removing the mandrel patterns; and
   patterning the hard mask structure and the dielectric layer to transfer a pattern of the spacer mask into the hard mask structure and the dielectric layer.

10. The method of claim 9, wherein thinning the portion of the first spacer layer comprises: forming a patterned mask to cover the first portion of the first spacer layer within the first region; and
   etching the exposed portion of the first spacer layer using the patterned mask as an etching mask to form the first spacer layer having the first portion and the second portion.

11. The method of claim 9, wherein the first spacer layer and the second spacer layer are respectively formed by a single deposition step, and the second spacer layer is formed with the same thickness as the first spacer layer prior to performing the thinning step.

12. The method of claim 9, wherein a first distance between the bottom surface of the second spacer portion and the bottom surface of the first spacer portion is larger than a second distance between the bottom surface of the fourth spacer portion and the bottom surface of the third spacer portion.

13. The method of claim 9, wherein after etching back the second spacer layer and etching back the partially thinned first spacer layer to form the spacer mask, the first spacer portion and the third spacer portion has a L-shaped structure.

14. A method of forming a semiconductor structure, comprising:
   providing a substrate;
   forming an etching stop layer;
   forming a dielectric layer over the substrate and on the etching stop layer;
   forming a spacer material layer over the substrate and on the dielectric layer, wherein the spacer material layer comprises a first part having a first thickness and a second part having a second thickness less than the first thickness;
   etching the spacer material layer to form a plurality of first spacers and a plurality of second spacers, wherein the plurality of first spacers is a remained portion of the first part of the spacer material layer, and the plurality of second spacers is a remained portion of the second part of the spacer material layer, and wherein the plurality of first spacers comprises a first spacer portion and a second spacer portion disposed on the first spacer portion, and the plurality of second spacers comprises a third spacer portion and a fourth spacer portion disposed on the third spacer portion, and a thickness of the fourth spacer portion is greater than a thickness of the second spacer portion;
   patterning the etching stop layer and the dielectric layer using the plurality of first spacers and the plurality of second spacers to form a patterned etching stop layer and a patterned dielectric layer, wherein the patterned dielectric layer is fonned to have a first dielectric portion and a second dielectric portion, and the patterned etching stop layer is underlying the patterned dielectric layer; and
   forming a conductive layer laterally aside the patterned dielectric layer, and laterally aside the patterned etching stop layer, comprising:
      forming first conductive lines spaced apart from each other by the first dielectric portion therebetween;
      forming second conductive lines spaced apart from each other by the second dielectric portion therebetween, wherein a first spacing between the first conductive lines is different from a second spacing between the second conductive lines.

15. The method of claim 14, wherein the first dielectric portion is formed to have a first width different from a second width of the second dielectric portion, and the first spacing and the second spacing are defined by the first width and the second width, respectively.

16. The method of claim 14, wherein a capacitance between the first conductive lines is less than a capacitance between the second conductive lines.

17. The method of claim 14, wherein the patterned etching stop layer comprises etching stop portions having different widths.

18. The method of claim 14, wherein top surfaces of the plurality of first spacers are aligned with top surfaces of the plurality of second spacers.

19. The method of claim 14, wherein the first conductive lines are formed to extend in a first direction, and are spaced apart from each other in a second direction perpendicular to the first direction, and the second conductive lines are formed to extend in the first direction, and are spaced apart from each other in the second direction perpendicular to the first direction.

20. The method of claim 14, further comprising:
  forming a first hard mask layer over the substrate and on the dielectric layer;
  forming a second hard mask layer over the substrate and on the first hard mask layer;
  forming a third hard mask layer over the substrate and on the second hard mask layer; and
  forming a fourth hard mask layer over the substrate and on the third hard mask layer, wherein the spacer material layer is formed on the fourth hard mask layer.

* * * * *